(12) United States Patent
Yun et al.

(10) Patent No.: US 7,187,022 B2
(45) Date of Patent: Mar. 6, 2007

(54) SEMICONDUCTOR DEVICE HAVING A MULTI-BRIDGE-CHANNEL AND METHOD FOR FABRICATING THE SAME

(75) Inventors: Eun-jung Yun, Seoul (KR); Sung-min Kim, Incheon Metropolitan (KR); Sung-young Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/285,300

(22) Filed: Nov. 23, 2005

(65) Prior Publication Data

US 2006/0121687 A1    Jun. 8, 2006

(30) Foreign Application Priority Data

Dec. 6, 2004    (KR) .................... 10-2004-0101662

(51) Int. Cl.
*H01L 29/80* (2006.01)
(52) U.S. Cl. ............... 257/287; 257/341; 257/E21.418; 257/401; 257/E29.257; 438/186
(58) Field of Classification Search ................ 257/287, 257/341, 365, 401, E21.418, E29.257; 438/186
See application file for complete search history.

(56) References Cited

U.S. PATENT DOCUMENTS 6,207,511 B1    3/2001    Chapman et al. ........... 438/284
6,562,665 B1    5/2003    Yu ............................. 438/149
6,800,910 B2 *  10/2004   Lin et al. .................... 257/410

FOREIGN PATENT DOCUMENTS

KR    10-2004-0075566    8/2004

* cited by examiner

*Primary Examiner*—Quoc Hoang
(74) *Attorney, Agent, or Firm*—Lee & Morse, P.C.

(57) ABSTRACT

In a semiconductor device having a multi-bridge-channel, and a method for fabricating the same, the device includes first and second semiconductor posts protruding from a surface of a semiconductor substrate and having a source and a drain region, respectively, in upper side portions thereof, channel semiconductor layers connecting upper side portions of the first and second semiconductor posts, a gate insulation layer on the channel semiconductor layers and the semiconductor substrate, the gate insulation layer surrounding at least a portion of the channel semiconductor layers, a gate electrode layer on the gate insulation layer to enclose at least a portion of a region between the channel semiconductor layers, and junction auxiliary layers formed between the channel semiconductor layers, the junction auxiliary layers contacting the gate electrode layer and upper side portions of the first and second semiconductor posts, and having a same width as the channel semiconductor layers.

10 Claims, 15 Drawing Sheets

SEMICONDUCTOR DEVICE HAVING A MULTI-BRIDGE-CHANNEL AND METHOD FOR FABRICATING THE SAME

BACKGROUND OF THE INVENTION

1. Field of the Invention

The present invention relates to a semiconductor device and a method for fabricating the same. More particularly, the present invention relates to a semiconductor device having a multi-bridge-channel (MBC) metal oxide semiconductor field effect transistor (MBC) formed by self-alignment and a method for fabricating the same.

2. Description of the Related Art

To more highly integrate semiconductor devices, a length of gate channels is decreased. A short channel length, however, generates several problems, such as a short channel effect, a fine pattern formation, and limitations on operation speed. The short channel effect is a particularly severe problem. For example, an electric field increase in a vicinity of a drain region causes a punch-through, in which a drain depletion region penetrates up to an electric potential wall in a vicinity of a source region. Further, thermal electrons cause an avalanche and a vertical electric field decreases mobility of carriers.

In an effort to eliminate the short channel effect, several gate structures including a MOST having a multi-bridge-channel (MBC) have been suggested. A conventional MBC includes, e.g., a gate electrode layer enclosing a plurality of thin channel semiconductor layers having a rectangular shape. In such a conventional MBC, a channel semiconductor layer has a very wide area. Thus, the MBC is under a small influence of an electric field in the vicinity of a drain region, which eliminates the short channel effect.

Such a conventional MBC, however, is subjected to two separate photoetching processes including a process for forming the channel semiconductor layer and a process for forming the gate electrode covering and surrounding the channel semiconductor layer. Disadvantageously, misalignments are generated between the gate electrodes and the channel semiconductor layers during these processes.

SUMMARY OF THE INVENTION

The present invention is therefore directed to a semiconductor device having a multi-bridge-channel (MBC) metal oxide semiconductor field effect transistor (MBC) formed by self-alignment and a method for fabricating the same, which substantially overcome one or more of the problems due to the limitations and disadvantages of the related art.

It is therefore a feature of an embodiment of the present invention to provide a semiconductor device having a multi-bridge-channel, and a method for fabricating the same, that is able to prevent misalignment between a gate electrode and channel semiconductor layers by forming the gate electrode in a self-aligning manner.

It is therefore another feature of an embodiment of the present invention to provide a semiconductor device having a multi-bridge-channel, and a method for fabricating the same, in which it is possible to form channel semiconductor layers having a same threshold voltage using interim insulation spacers having a same thickness.

At least one of the above and other features and advantages of the present invention may be realized by providing a semiconductor device having a multi-bridge-channel including a first semiconductor post protruding a first predetermined height from a surface of a semiconductor substrate and having a source region in an upper side portion thereof, a second semiconductor post protruding a second predetermined height from the surface of the semiconductor substrate, the second semiconductor post facing the first semiconductor post and having a drain region in an upper side portion thereof, a pair of channel semiconductor layers connecting the upper side portion of the first semiconductor post to the upper side portion of the second semiconductor post, a gate insulation layer on the pair of channel semiconductor layers and the semiconductor substrate, the gate insulation layer surrounding at least a portion of the pair of channel semiconductor layers, a gate electrode layer on the gate insulation layer to enclose at least a portion of a region between the pair of channel semiconductor layers, and a pair of junction auxiliary layers formed between the pair of channel semiconductor layers, the pair of junction auxiliary layers contacting the gate electrode layer, the upper side portion of the first semiconductor post, and the upper side portion of the second semiconductor post, and having a same width as a width of the pair of channel semiconductor layers.

The first predetermined height and the second predetermined height may be the same.

The surface of the semiconductor substrate may be a bottom of a trench etched a predetermined depth from an upper surface of the semiconductor substrate.

The semiconductor device may further include an insulation mask pattern on the first and second semiconductor posts and insulation spacers on facing lateral walls of the insulation mask pattern. A width of the insulation spacers may be the same as a width of the pair of junction auxiliary layers. A width of the insulation spacers may be constant from a lower portion thereof to an upper portion thereof.

An upper surface of the pair of channel semiconductor layers may be coplanar with upper surfaces of the first and second semiconductor posts.

The pair of channel semiconductor layers may connect both ends of the upper side portion of the first semiconductor post to both ends of the upper side portion of the second semiconductor post.

The gate electrode layer may enclose both lateral walls and an upper surface of the pair of channel semiconductor layers and may be self-aligned between the insulation spacers.

The pair of channel semiconductor layers and the pair of junction auxiliary layers may be silicon epitaxial layers.

At least one of the above and other features and advantages of the present invention may be realized by providing a method for fabricating a semiconductor device having a multi-bridge-channel including forming a semiconductor wall having a predetermined height from a surface of a semiconductor substrate, the semiconductor wall extending in a first direction, forming an isolation layer surrounding the semiconductor wall, forming a pair of semiconductor posts facing and spaced apart from each other by removing a portion of the semiconductor wall, forming a sacrificial layer between the pair of semiconductor posts and the isolation layer, the sacrificial layer being a same distance apart from each of the pair of semiconductor posts and the isolation layer, epitaxially growing a single crystal layer on the sacrificial layer, lateral walls of the pair of semiconductor posts, and the isolation layer, forming a pair of channel semiconductor layers connecting facing upper side portions of the pair of semiconductor posts and forming a pair of junction auxiliary layers between the pair of channel semiconductor layers to contact the pair of semiconductor posts by removing a portion of the single crystal layer so that a height of the single crystal layer and a height of the sacrificial layer are the same, forming insulation spacers on the pair of junction auxiliary layers, removing the sacrificial layer, forming a gate insulation layer on and surrounding the pair of channel semiconductor layers between the insulation spacers, and forming a gate electrode layer on the gate insulation layer between the insulation spacers.

Forming the pair of semiconductor posts facing each other and spaced apart from each other by removing a portion of the semiconductor wall may include forming an insulation mask pattern defining a space therein and extending in a second direction, which is perpendicular to the first direction, on both sides of the semiconductor wall, and removing the portion of the semiconductor wall exposed by the space in the insulation mask pattern using the insulation mask pattern and the isolation layer for etching masks.

The method may further include forming an etch stop layer covering a lateral wall of the insulation mask pattern, after forming the insulation mask pattern.

The sacrificial layer may be a silicon germanium (SiGe) epitaxial layer.

Forming the sacrificial layer between the pair of semiconductor posts may include forming an interim insulation spacer material layer covering lateral walls of the pair of semiconductor posts, a bottom of an opening formed in the semiconductor wall by the removal of the portion of the semiconductor wall, and a lateral wall of an insulation mask pattern defining a space therein and extending in a second direction, which is perpendicular to the first direction, forming interim insulation spacers exposing the bottom of the opening formed in the semiconductor wall by performing anisotropic-dry etching on the interim insulation spacer material layer, and epitaxially growing a sacrificial layer in an opening between the interim insulation spacers.

The interim insulation spacer material layer may be a nitride film/oxide film or an oxide film.

A width of the interim insulation spacer may be constant from a lower portion thereof to an upper portion thereof.

A length of the pair of channel semiconductor layers may be determined by a width of the interim insulation spacers.

The method may further include removing the interim insulation spacers using a wet etching before epitaxially growing the single crystal layer between the pair of semiconductor posts and the isolation layer.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIGS. 3A through 14A illustrate perspective views of stages in a process for fabricating a semiconductor device having a multi-bridge-channel according to an embodiment of the present invention, and FIGS. 3B through 14B illustrate cross-sectional views of stages in a process for fabricating a semiconductor device having a multi-bridge-channel according to an embodiment of the present invention taken along line A—A of FIG. 3A.

DETAILED DESCRIPTION OF THE INVENTION

Figure 1A:
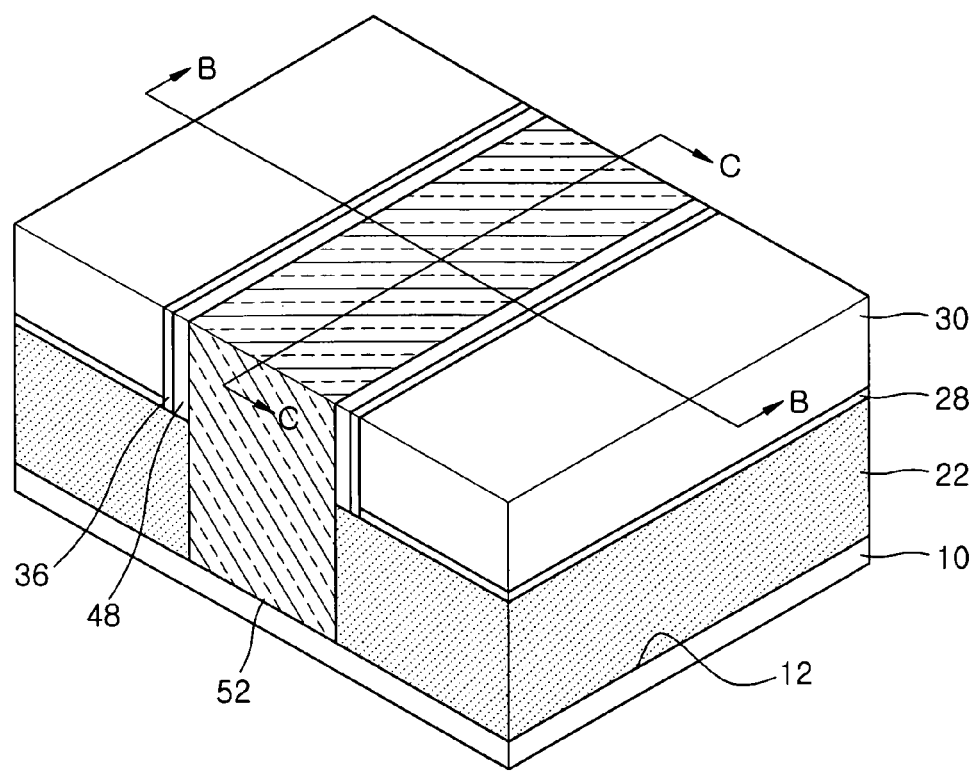
FIG. 1A illustrates a perspective view of a semiconductor device having a multi-bridge-channel formed by self-alignment according to an embodiment of the present invention.

Korean Patent Application No. 10-2004-0101662, filed on Dec. 6, 2004, in the Korean Intellectual Property Office, and entitled: "Semiconductor Device Having Multi-Bridge-Channel and Method for Fabricating the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1B:
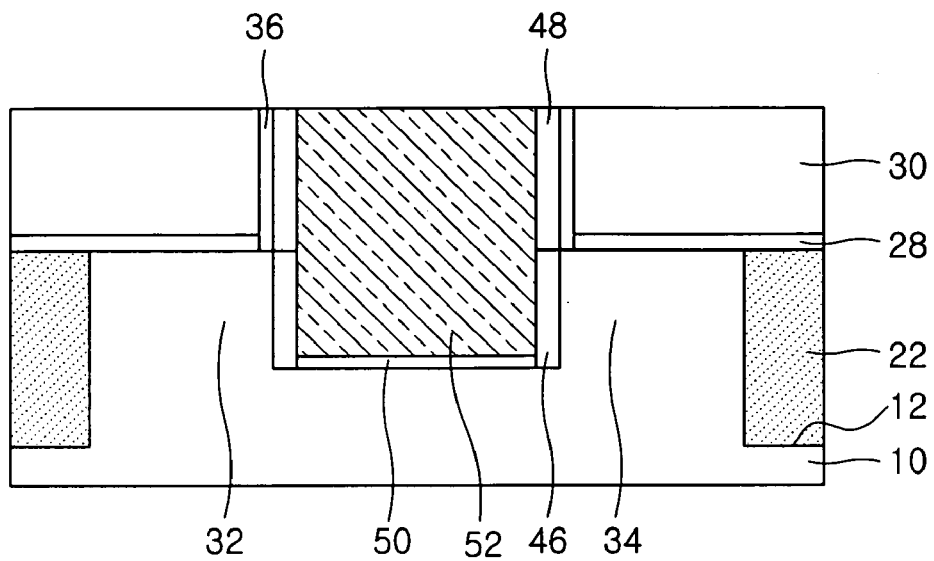
FIGS. 1B and 1C illustrate cross-sectional views taken along lines B—B and C—C of FIG. 1A, respectively.
Figure 1C:
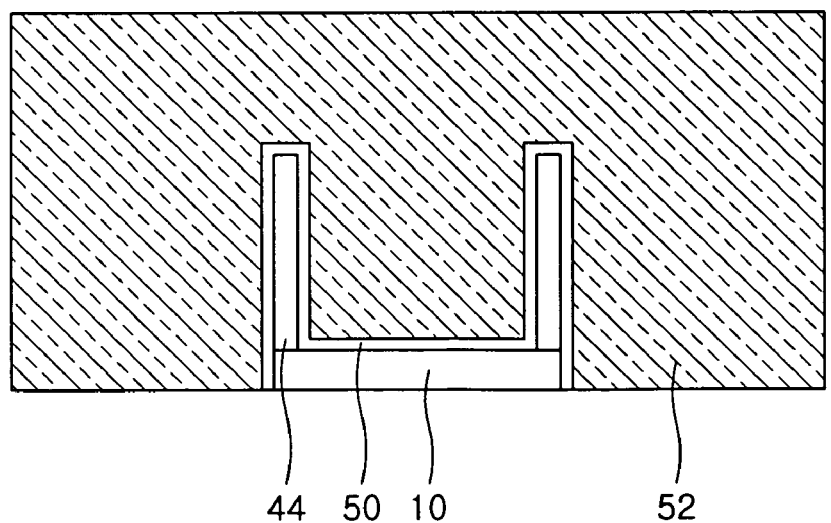

FIG. 1A illustrates a perspective view of a semiconductor device having a multi-bridge-channel formed by self-alignment according to an embodiment of the present invention. FIGS. 1B and 1C illustrate cross-sectional views taken along lines B—B and C—C of FIG. 1A, respectively.

Referring to FIGS. 1A through 1C, a first semiconductor post 32 having a source region in an upper side portion thereof protrudes a first predetermined height from a surface 12 of a semiconductor substrate 10. A second semiconductor post 34 having a drain region in an upper side portion thereof faces the first semiconductor post 32 and protrudes a second predetermined height from the surface 12 of the semiconductor substrate 10. The first predetermined height and the second predetermined height may be the same. The surface 12 of the semiconductor substrate 10 may be a bottom surface 12 of a trench etched a predetermined depth from an upper surface of the semiconductor substrate 10. An isolation layer 22 defines an activation region of the semiconductor substrate 10.

At least a pair of channel semiconductor layers 44, which are grown in an epitaxial manner, are connected to each other in a form of a bridge-type connection between the upper side portions of the first and second semiconductor posts 32 and 34. The channel semiconductor layers 44 extend in a first direction, i.e., the x-direction in FIG. 1A. The channel semiconductor layers 44 may have a thin rectangular shape. Further, the channel semiconductor layers 44 may be connected between both ends of the upper side portions of the first and second semiconductor posts 32 and 34. Upper surfaces of the channel semiconductor layers 44 may be coplanar with upper surfaces of the first and second semiconductor posts 32 and 34.

The present embodiment includes a pair of junction auxiliary layers 46, which are grown in an epitaxial manner, having a same width as the channel semiconductor layers 44. The junction auxiliary layers 46 are formed between the channel semiconductor layers 44 and contact a gate electrode layer 52 and the upper side portions of the first and second semiconductor posts 32 and 34. More specifically, the junction auxiliary layers 46 extend in a second direction, i.e., the y-direction in FIG. 1A, which is perpendicular to the first direction. The channel semiconductor layers 44 and the junction auxiliary layers 46 are connected to each other and have a same width and height to form a structure defining an empty quadrangle. The channel semiconductor layers 44 and the junction auxiliary layers 46 may be silicon epitaxial layers.

An insulation mask pattern 30 defining a space therein is formed on the first and second semiconductor posts 32 and 34 with a pad oxide film pattern 28 interposed therebetween. Insulation spacers 48 are formed on facing lateral walls of the insulation mask pattern 30. An etch stop layer 36 may be interposed between the insulation spacers 48 and the insulation mask pattern 30. Accordingly, the insulation spacers 48 cover a lateral wall of the etch stop layer 36 and are positioned on the junction auxiliary layers 46. The lateral wall of the etch stop layer 36 in turn covers a lateral wall of the pad oxide film 28. Bottom surfaces of the insulation spacer 48 have a same width as a width of the junction auxiliary layers 46, which are grown in an epitaxial manner. Further, a width at a lower portion of the insulation spacers 48 and a width at an upper portion thereof may be constant. In the alternative, a width at the lower portion of the insulation spacers 48 may be rounded toward the upper portion thereof.

A gate insulation layer 50 may be interposed between the gate electrode layer 52 and the channel semiconductor layers 44 and the semiconductor substrate 10. The gate insulation layer 50 may have a shape enclosing at least a portion of a center of the channel semiconductor layers 44. The gate electrode layer 52 may have a structure covering both lateral surfaces of the channel semiconductor layers 44 and the upper surfaces thereof. Further, the gate electrode layer 52 may enclose and surround the channel semiconductor layers 44 and may be buried in a self-aligning manner between the insulation spacers 48, which face each other.

Figure 2A:
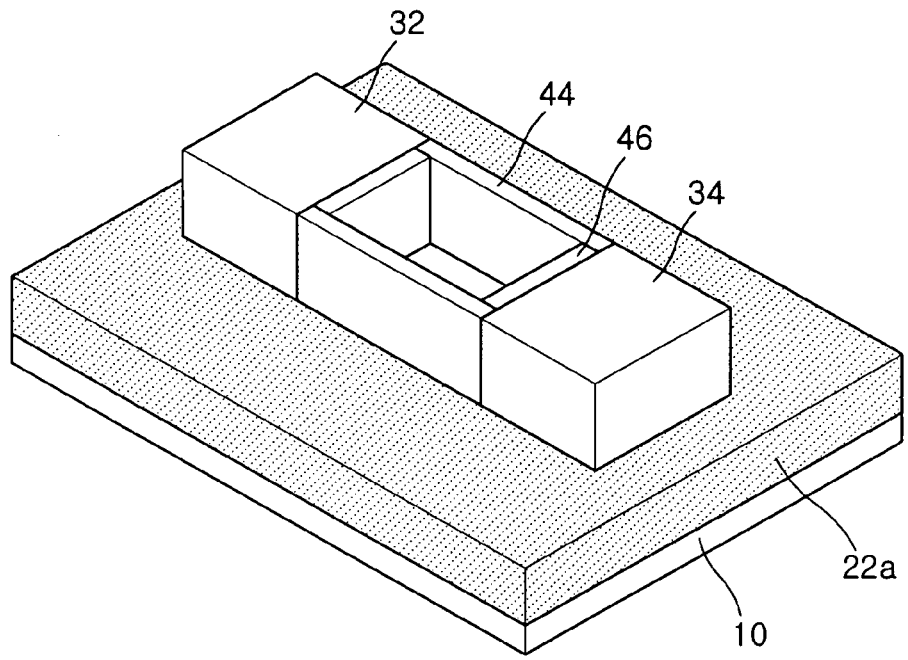
FIG. 2A illustrates a perspective view of a semiconductor device having a multi-bridge-channel according to an embodiment of the present invention wherein a portion of an isolation layer is removed so that a portion of an activation region may be exposed.
Figure 2B:
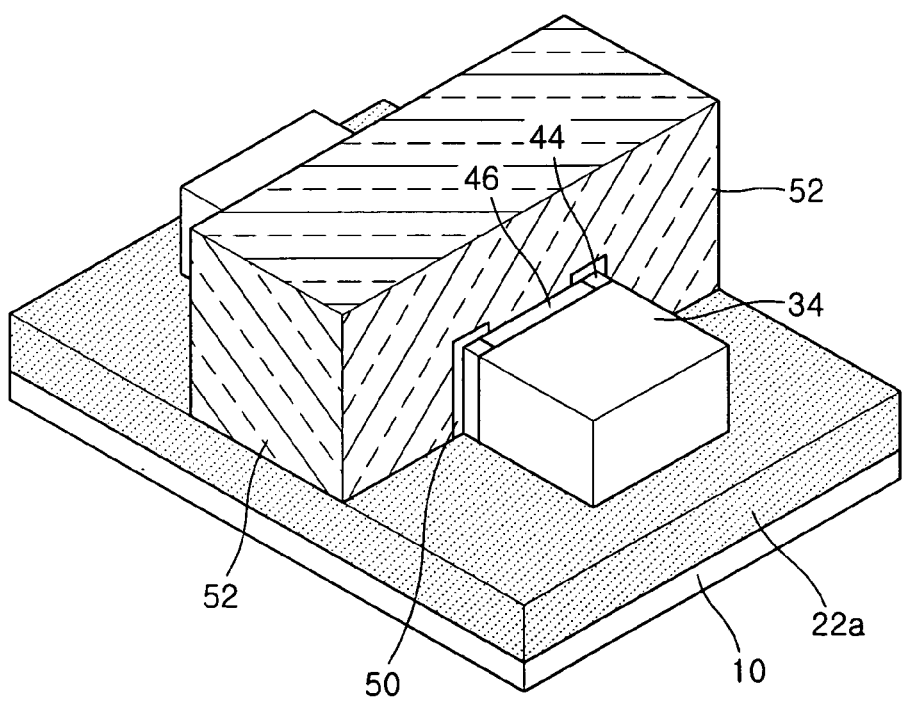
FIG. 2B illustrates a perspective view of the semiconductor device shown in FIG. 2A including a gate electrode layer covering a channel semiconductor layer.

FIG. 2A illustrates a perspective view of a semiconductor device having a multi-bridge-channel according to an embodiment of the present invention wherein a portion of the isolation layer 22 is removed so that a portion of an activation region may be exposed. FIG. 2B illustrates a perspective view of the semiconductor device having a multi-bridge-channel shown in FIG. 2A including the gate electrode layer 52 covering the channel semiconductor layers 44.

Referring to FIGS. 2A and 2B, the activation layer protrudes from the isolation layer 22a, a portion of which has been removed. The activation layer includes the channel semiconductor layers 44, the junction auxiliary layers 46, and the first and second semiconductor posts 32 and 34 separated by the channel semiconductor layers 44, as explained in connection with FIGS. 1A through 1C. The gate electrode layer 52 covers both lateral surfaces of the channel semiconductor layers 44 and an upper surface thereof while exposing the junction auxiliary layers 46. A width of the gate electrode layer 52 is the same as an interval between the junction auxiliary layers 46. Accordingly, the junction auxiliary layers 46 and the channel semiconductor layers 44 between the first and second semiconductor posts 32 and 34 can be used for source/drain regions. In the present embodiment, areas of the source/drain regions are greatly extended so that electrical resistance can be reduced.

Figure 3A:
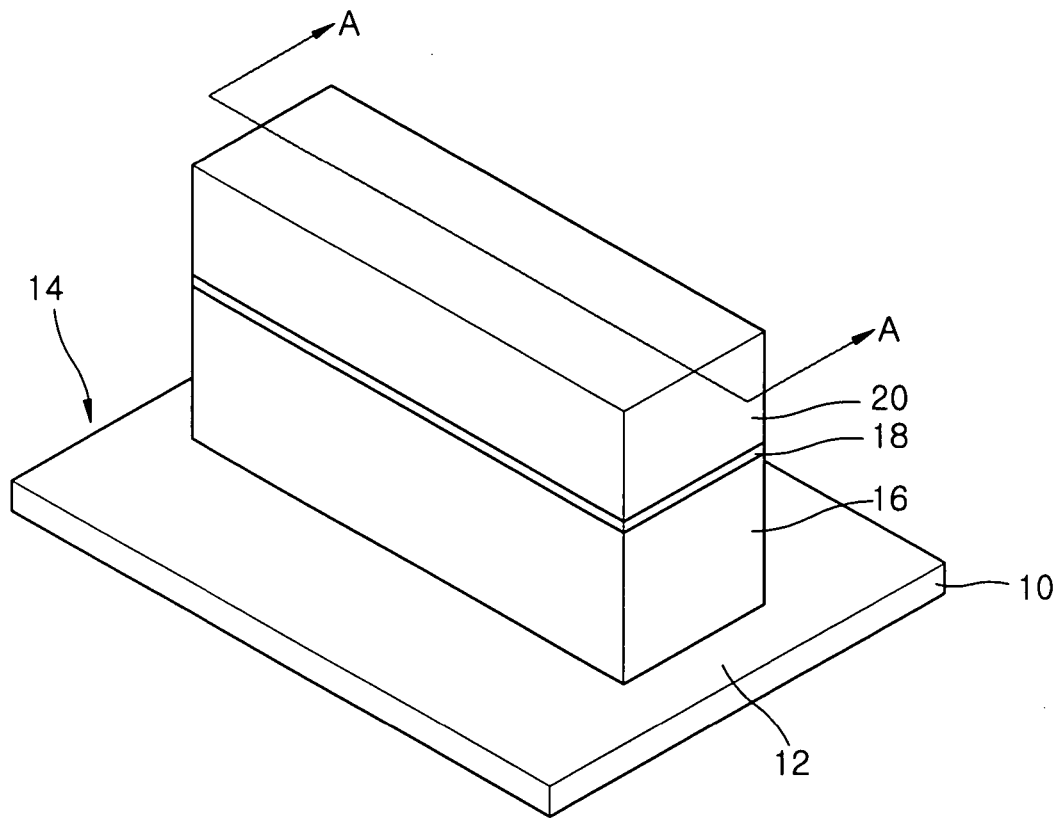
Figure 3B:
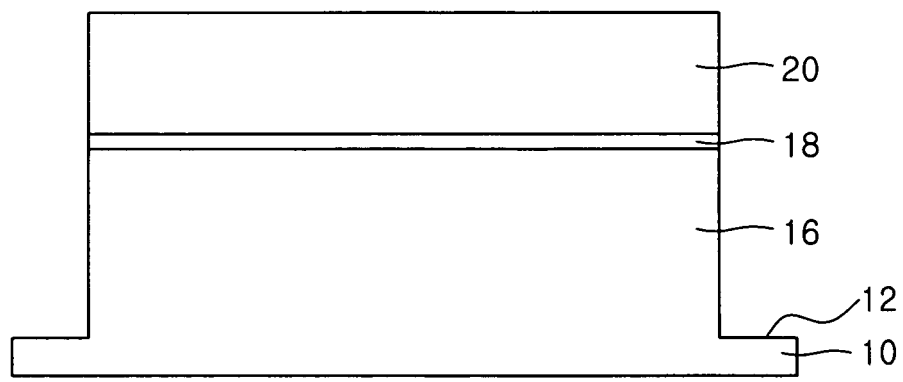

FIGS. 3A through 14A illustrate perspective views of stages in a process for fabricating a semiconductor device having a multi-bridge-channel according to an embodiment of the present invention. FIGS. 3B through 14B illustrate cross-sectional views of stages in a process for fabricating a semiconductor device having a multi-bridge-channel according to an embodiment of the present invention taken along line A—A of FIG. 3A.

Referring to FIGS. 3A through 14B, a wall 16 having a predetermined height from the surface 12 of the semiconductor substrate 10 made of single crystal silicon and extending in the first direction, i.e., the x-direction of FIG. 1A, is formed. The wall 16 is formed of the semiconductor substrate 10 and may have a stripe shape. More specifically, by filling a trench 14 including the surface 12 of the semiconductor substrate 10 with an insulation material to form the isolation layer 22, the semiconductor substrate 10 enclosed by the isolation layer 22 becomes the wall 16 of the semiconductor substrate 10 having a predetermined height from the surface 12 of the semiconductor substrate 10. The surface 12 may be an etched surface of the semiconductor substrate 10 that has been removed in order to form the isolation layer 22.

A variety of insulation material layers, e.g., an oxide layer and a nitride layer, may be used for the isolation layer 22. For example, the present embodiment may use a high density plasma (HDP) oxide film. In the present invention, since a process for using an etching mask is associated with the isolation layer 22, a material for the isolation layer 22 is selected with consideration of an etching selection ratio with respect to an adjacent material.

Though a process for forming the isolation layer 22 is not illustrated in detail, general technology may be used to form an isolation layer in a vicinity of a surface of a semiconductor substrate. More specifically, a pad oxide layer (not shown) and a nitride layer (not shown) are first formed on an upper surface of the semiconductor substrate 10. A mask pattern consisting of a pad oxide film pattern 18 and a nitride film pattern 20 for defining an isolation layer 22 is formed by applying general photoetching technology using a photoresist layer. The semiconductor substrate 10 is then anisotropic dry-etched to a predetermined depth using the mask pattern to form the trench 14 in a vicinity of the surface 12 of the semiconductor substrate 10.

Figure 4A:
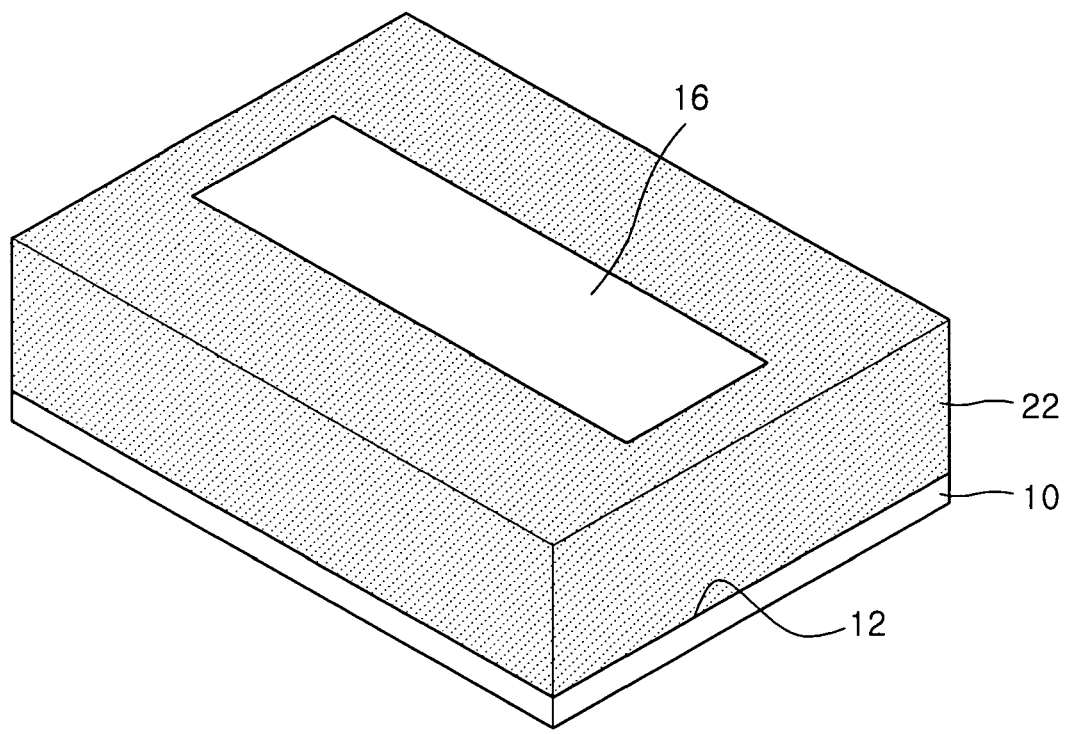
Figure 4B:
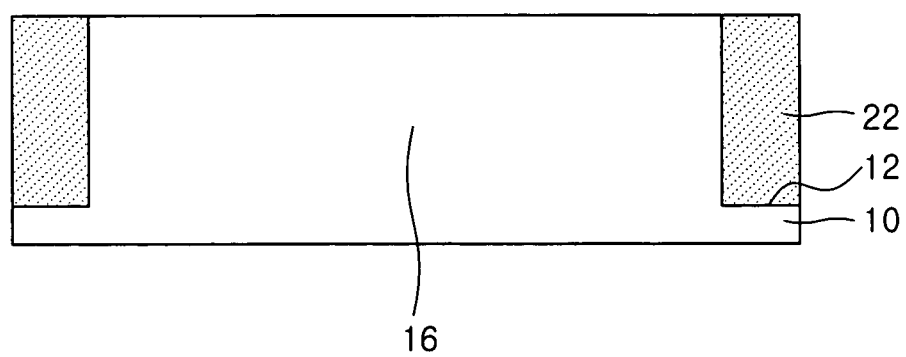

Referring to FIGS. 4A and 4B, after an insulation material made of oxides or nitrides fills the trench 14, an upper surface thereof is planarized and the mask pattern is removed, so that the isolation layer 22 surrounding the lateral walls of the wall 16 of the semiconductor substrate 10 is formed.

Figure 5A:
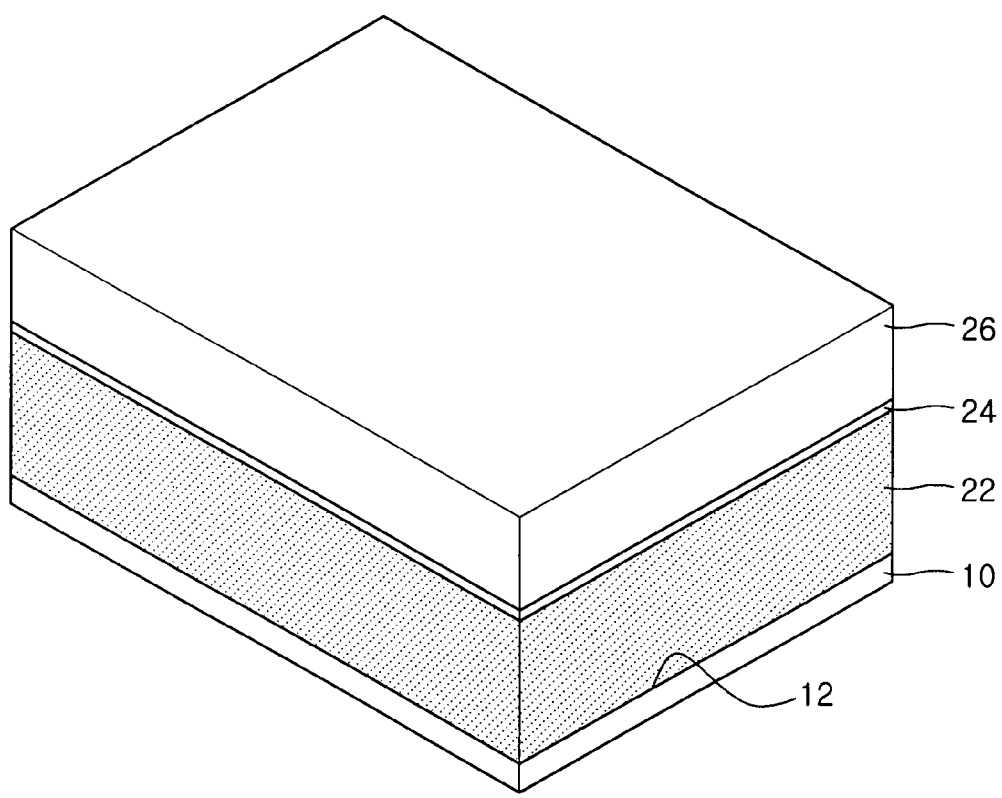
Figure 5B:
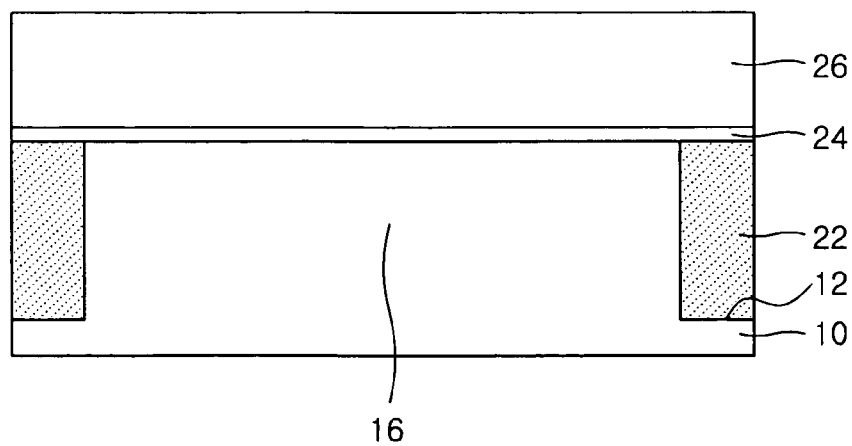

Referring to FIGS. 5A and 5B, after the isolation layer 22 and the wall 16 defined by the isolation layer 22 are formed, an insulation material layer 26 for a mask is formed on an upper surface of the wall 16 and the isolation layer 22. Though silicon nitride is exemplarily used for a material layer of the insulation mask pattern 30 in the present embodiment, other appropriate materials may be used with consideration of an etching selection ratio with respect to adjacent material layers. A pad oxide material layer 24 for a mask may additionally be formed under the insulation material layer 26 for the mask.

Figure 6A:
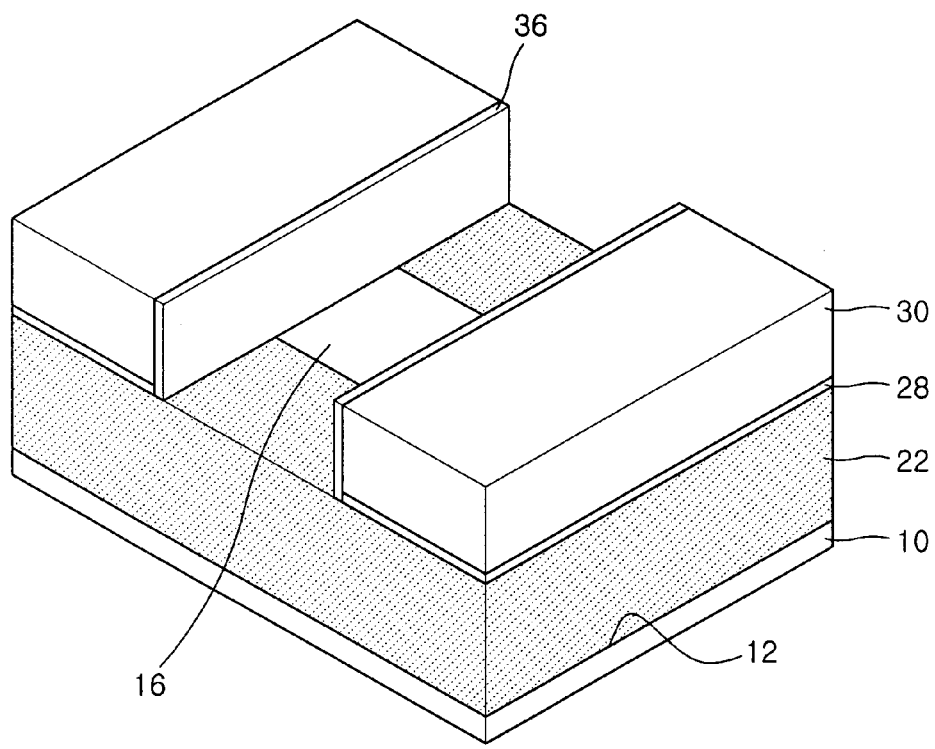
Figure 6B:
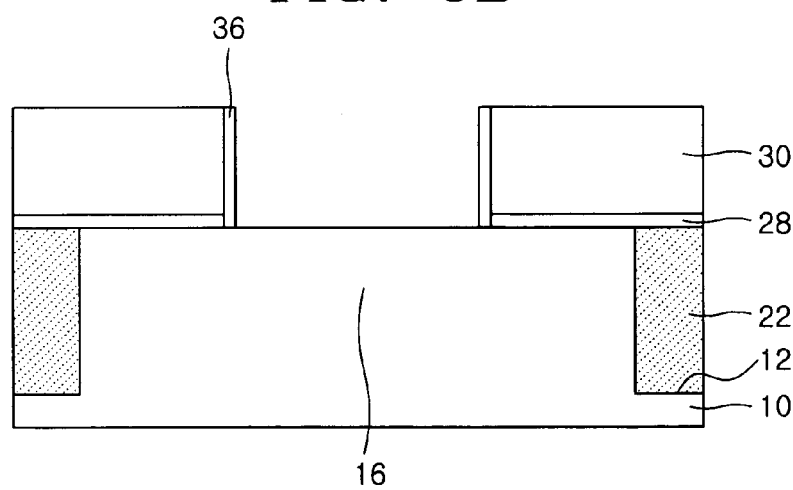

Referring to FIGS. 6A and 6B, an insulation mask pattern 30 defining a space therein is formed using a photoetching process. The insulation mask pattern 30 extends in a second direction, which is perpendicular to the first direction, in which the wall 16 of the semiconductor substrate 10 extends. The insulation mask pattern 30 may be used when forming the subsequent gate electrode layer using a damascene method. By controlling a size of the space defined by the insulation mask pattern 30, it is possible to easily control an effective channel length of the gate electrode, as described below. The pad oxide film pattern 28 having a same lateral wall profile as the insulation mask pattern 30 can be formed under the insulation mask pattern 30. The wall 16, having an upper surface coplanar with an upper surface of the isolation layer 22, is exposed by the space defined by the insulation mask pattern 30 and the isolation layer 22.

After an etch stop layer material layer (not shown) is deposited in a blanket manner on the upper surface of the semiconductor substrate 10 including the insulation mask pattern 30, the etch stop layer 36 may be formed using an isotropic dry-etching. A thickness of the etch stop layer 36 can be determined with consideration of the etching selection ratio. The etch stop layer 36 covers lateral walls of the insulation mask pattern 30 and the pad oxide film pattern 28. Formation of the etch stop layer 36 may be omitted in some embodiments of the present invention.

Figure 7A:
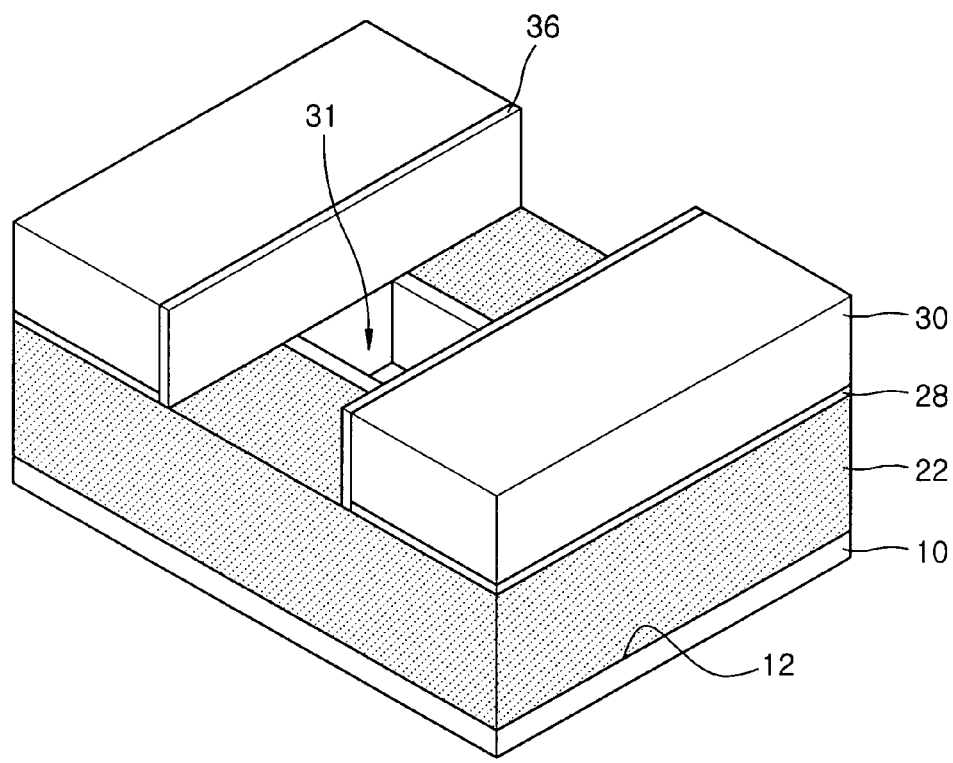
Figure 7B:
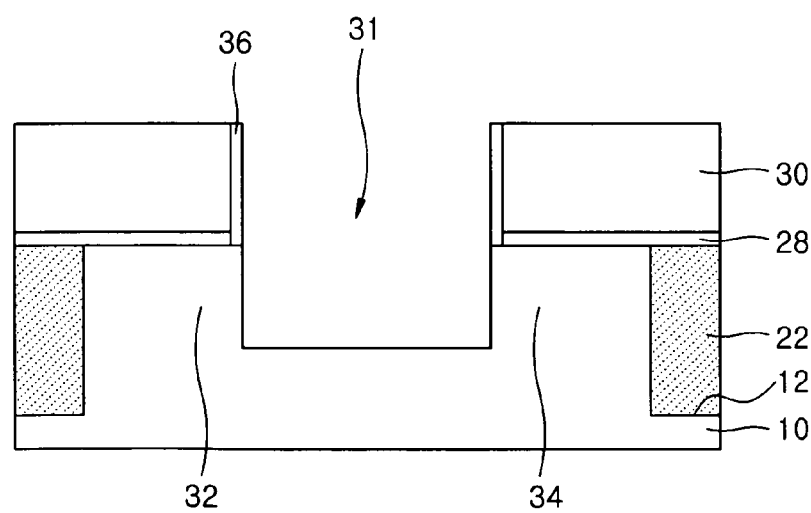

Referring to FIGS. 7A and 7B, using the etch stop layer 36 covering the lateral walls of the insulation mask pattern 30 and the pad oxide layer 28 and the isolation layer 22 for etching masks, a portion of the wall 16 that is exposed between the etch stop layer 36 and the isolation layer 22 is etched, so that an opening 31 is formed. Portions of upper side portions of the wall 16 are spaced apart from each other by the opening 31, so that the wall 16 is divided into the first and second semiconductor posts 32 and 34, which are a plurality of semiconductor post types. A source region and a drain region are respectively formed in upper side portions of the first and second semiconductor posts 32 and 34. Since a depth of the opening 31 is directly associated with an area of the subsequently formed channel semiconductor layers 44 of FIG. 2A, the depth is set according to a measure designed in advance. More specifically, as the depth of the opening 31 increases, an area of the channel semiconductor layers 44 is widened and as the depth decreases, the area of the channel semiconductor layer is narrowed.

Figure 8A:
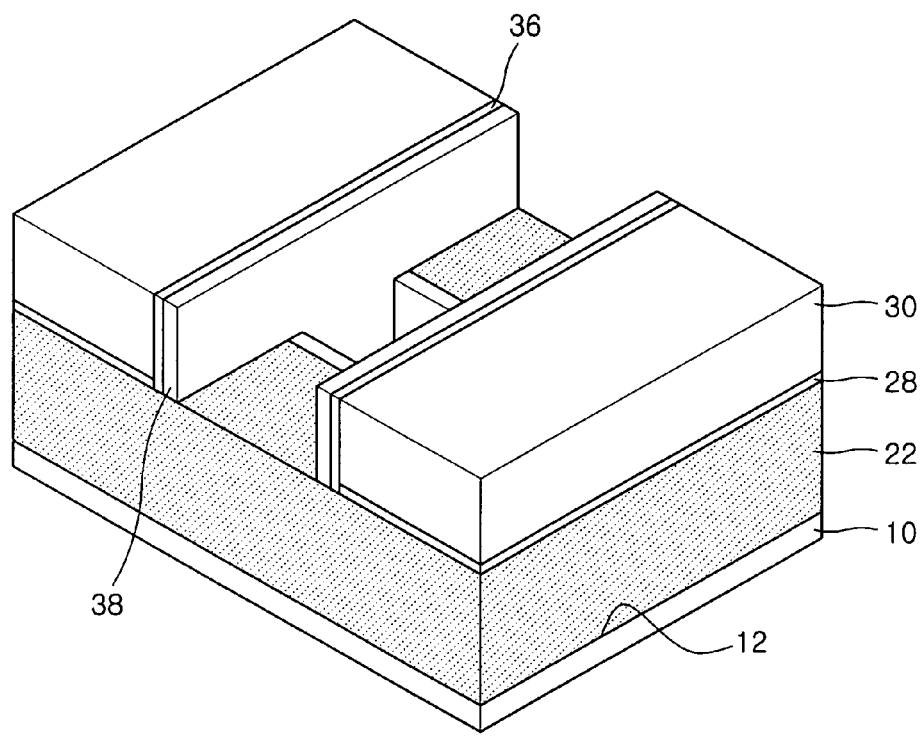
Figure 8B:
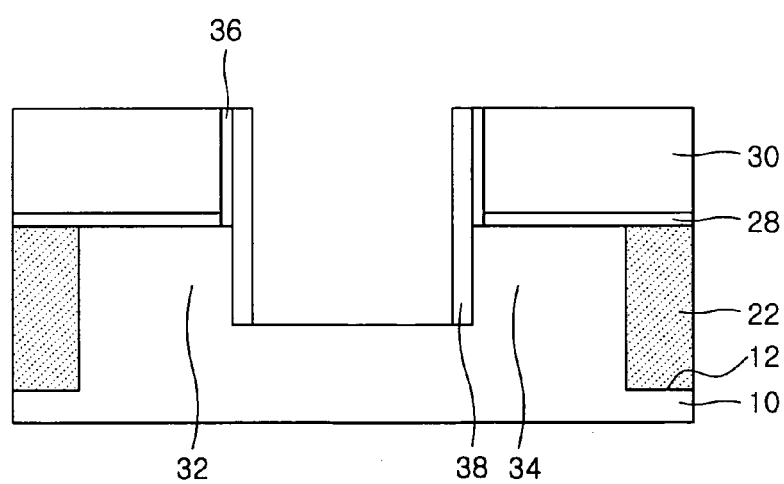

Referring to FIGS. 8A and 8B, after an insulation material layer is deposited on the upper side of the semiconductor substrate 10, in which the opening 31 defined by the isolation layer 22 and the semiconductor posts 32 and 34 at a lower portion of the insulation mask pattern 30 is formed, a front-anisotropic etching is performed, so that interim insulation spacers 38 are formed on lateral walls of the opening 31 and lateral walls of the etch stop layer 36. The interim insulation spacers 38 may be made of various materials such as oxides or nitrides. For example, when a nitride is used for the interim insulation spacers 38, an oxide film may be further formed as the etch stop layer 36 between the insulation mask pattern 30 and the interim insulation spacers 38. Oxides may be used with consideration of an etching selection ratio with respect to the semiconductor substrate 10 and the insulation mask pattern 30. If the interim insulation spacers 38 are an oxide, the etch stop layer 36 described in connection with FIG. 6A cannot be formed and is omitted.

Since a thickness of the interim insulation spacers 38 together with the above-described insulation mask pattern 30 is a factor that controls an effective channel length of the gate electrode, which will be described below, it is important to precisely form the thickness according to a designed measure. Further, a thickness of the interim insulation spacers 38 determines a width of the channel semiconductor layers 44, which will be described below. Since the widths of the channel semiconductor layers should be the same to have the same threshold voltage, the thickness of the interim insulation spacers 38 at the respective lateral walls of the opening 31 may be constant.

Figure 9A:
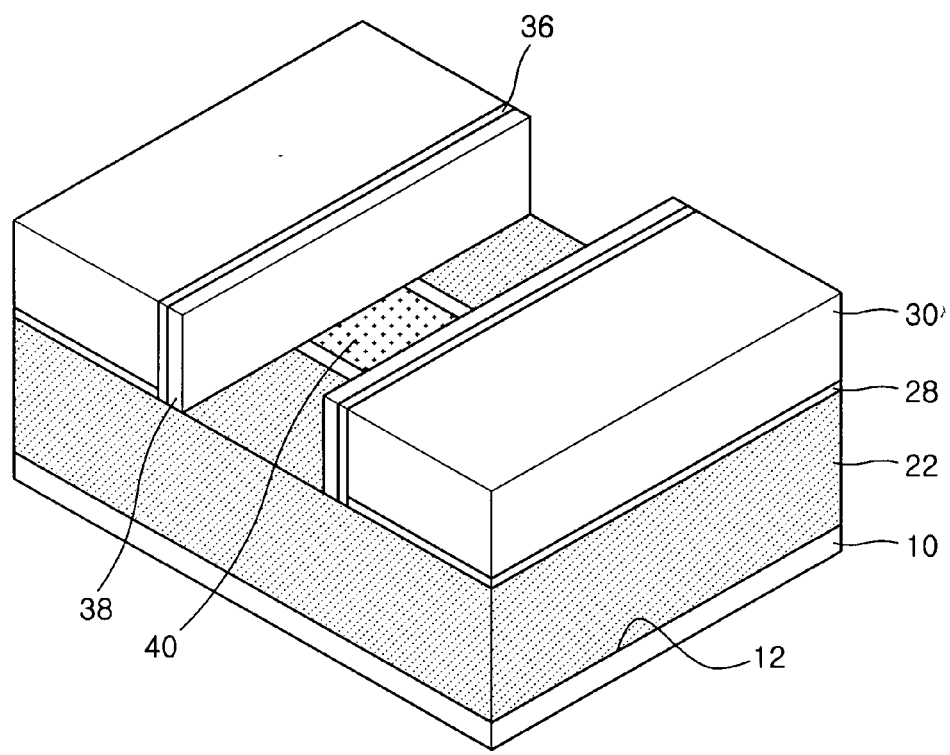
Figure 9B:
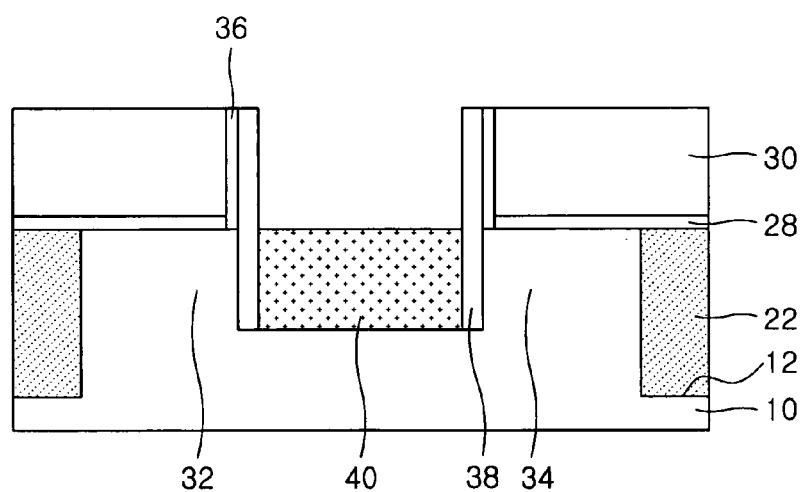

Referring to FIGS. 9A and 9B, a sacrificial layer 40 is formed on the exposed semiconductor substrate 10 between the interim insulation spacers 38 to fill the opening 31. The sacrificial layer 40 is not present in a final product of a semiconductor device, but is a material layer that can be temporarily used during a fabricating process. Thus, the sacrificial layer 40 may be provided in various ways. The sacrificial layer 40 may be formed using a material film having a lattice constant similar to that of the semiconductor substrate 10 and having an etching selection ratio with respect to the semiconductor substrate 10. For example, when the semiconductor substrate 10 is a single crystal silicon layer, the sacrificial layer 40 may be an epitaxial silicon germanium (SiGe) layer. If necessary, it is possible to remove surface defects of the sacrificial layer 40 using hydrogen annealing.

The sacrificial layer 40 may be formed using a molecular beam epitaxy method. $SiH_4$, $SiH_2Cl_2$, $SiCl_4$ or $Si_2H_6$ gases may be used as a silicon source gas to grow the sacrificial layer 40. Alternatively, $GeH_4$ gas may be used as a germanium source gas to grow the sacrificial layer 40.

However, if selective etching is possible for a silicon layer constituting the semiconductor layer 10 and an oxide material layer constituting the interim insulation spacers 38, which does not necessarily use the epitaxially grown material layer, the sacrificial layer 40 may also be formed using a method such as chemical vapor deposition (CVD) or physical vapor deposition (PVD). For example, the sacrificial layer 40 may be also formed by performing an appropriate etching process after a polysilicon layer is deposited by CVD and thermally treated.

Since the sacrificial layer 40 is defined by the interim insulation spacers 38 having the same thickness, the sacrificial layer 40 maintains the same interval from the pair of semiconductor posts 32 and 34 and the sides of the isolation layer 22. An upper surface of the sacrificial layer 40 may be coplanar with an upper surface of the pair of semiconductor posts 32 and 34.

Figure 10A:
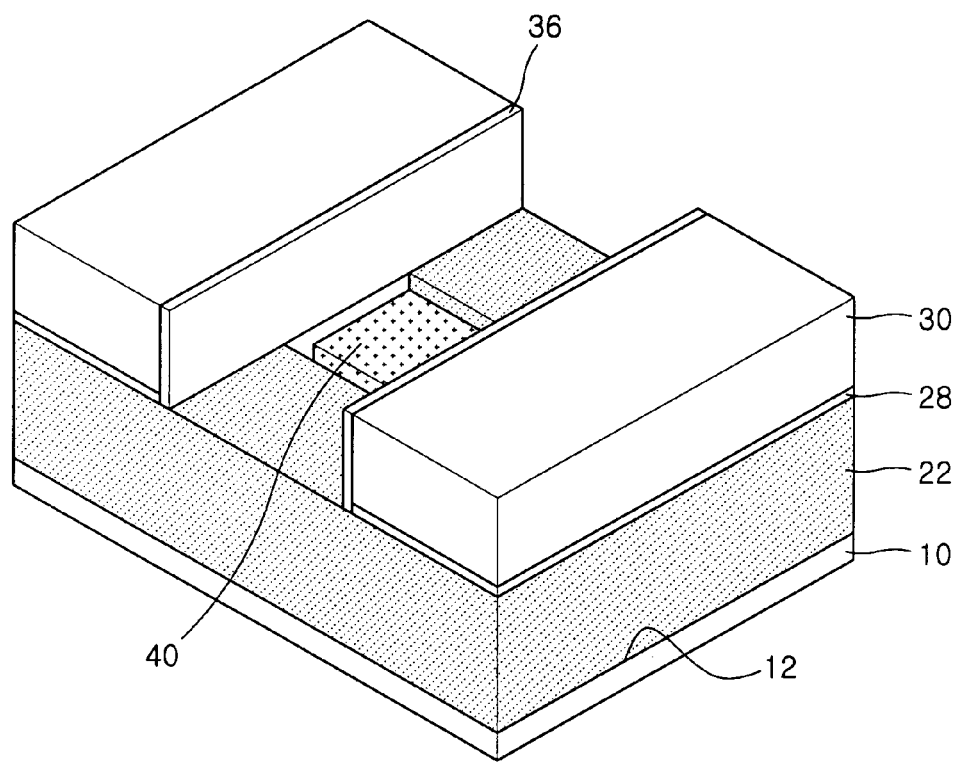
Figure 10B:
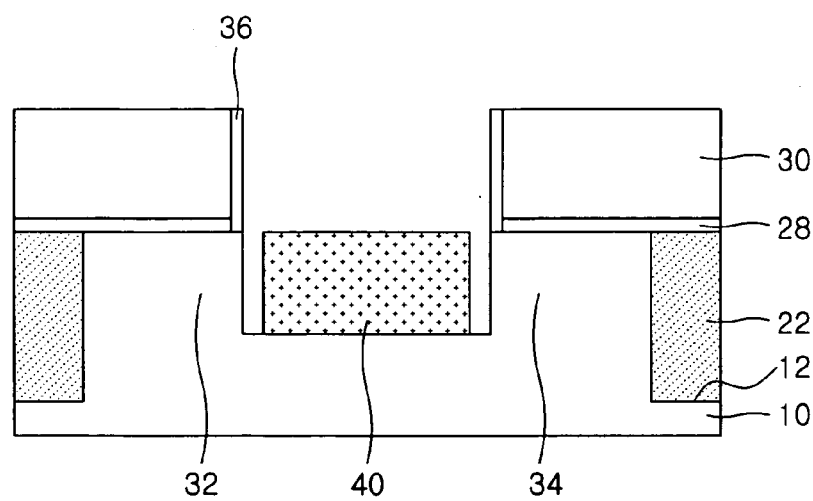

Referring to FIGS. 10A and 10B, the interim insulation spacers 38 are removed by wet-etching using the etch stop layer 36, the isolation layer 22, and the sacrificial layer 40 for etching masks. Resultantly, the pair of semiconductor posts 32 and 34 and the isolation layer 22, and the sacrificial layer 40 are spaced apart by the same interval in the first and second directions.

Figure 11A:
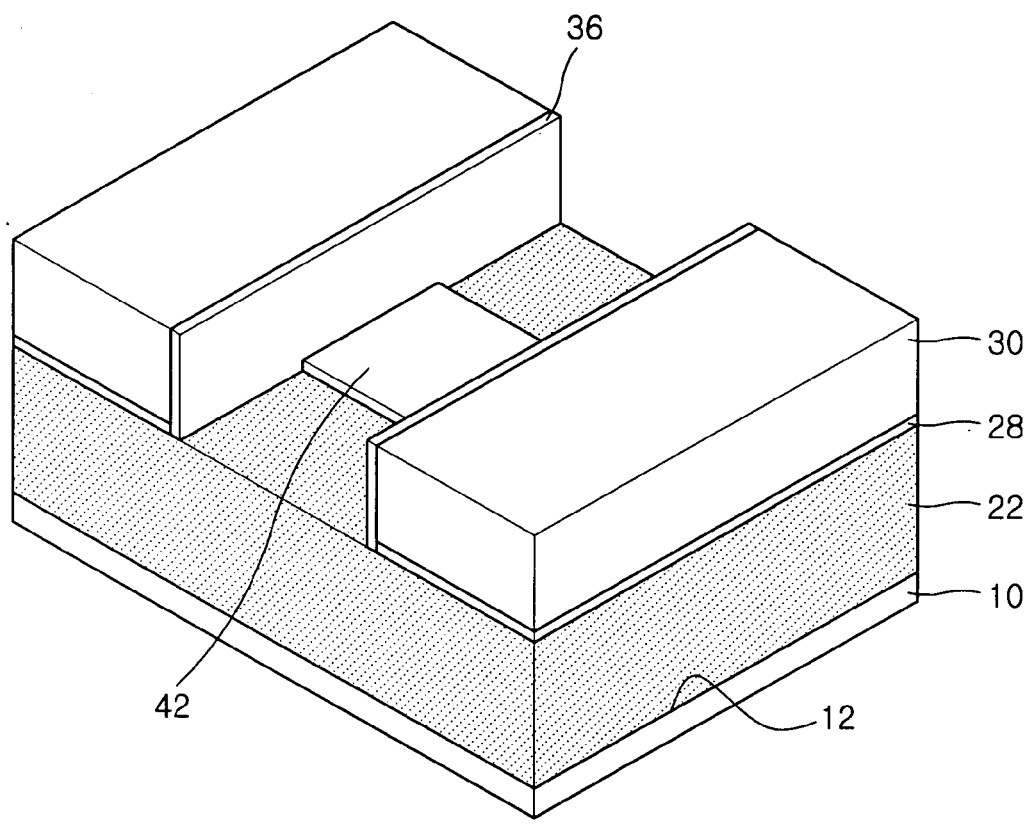
Figure 11B:
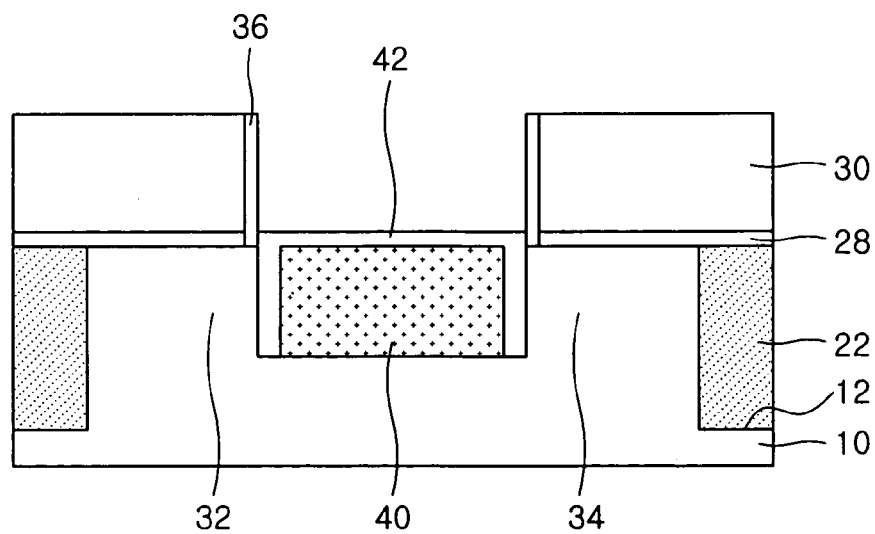

Referring to FIGS. 11A and 11B, a single crystal layer 42 is epitaxially grown in a space vacated by the interim insulation spacers 38. The present embodiment may form an epitaxial silicon layer with consideration of alignment with the semiconductor substrate 10 made of single crystal silicon. $SiH_4$, $SiH_2Cl_2$, $SiCl_4$ or $Si_2H_6$ gases may be used for a silicon source gas to grow the silicon layer.

Figure 12A:
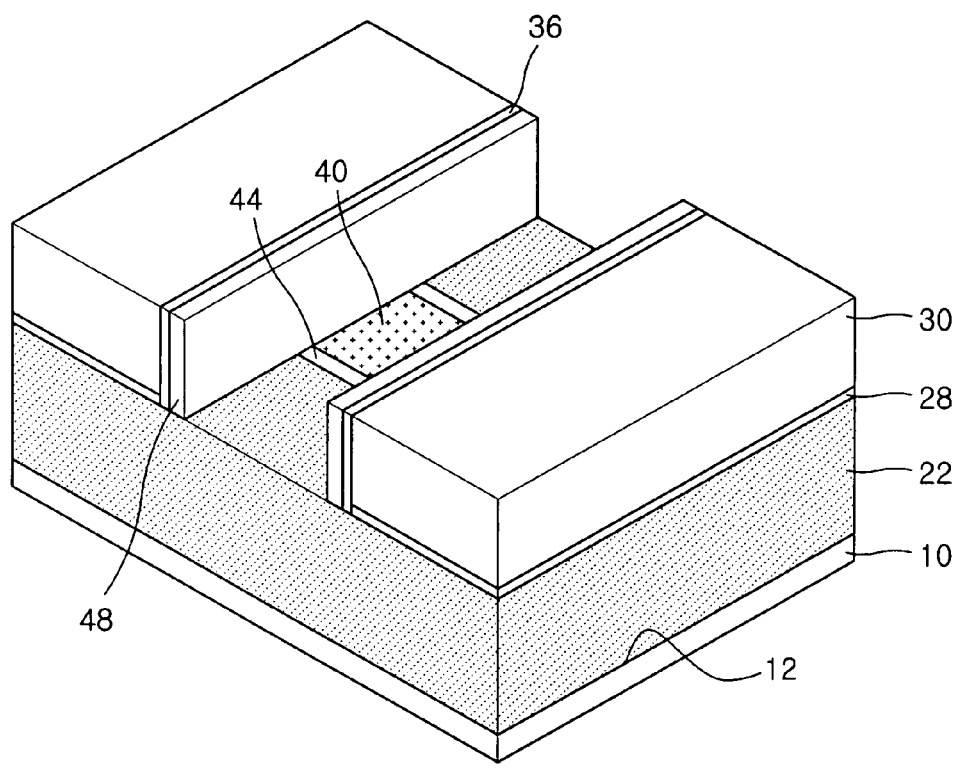
Figure 12B:
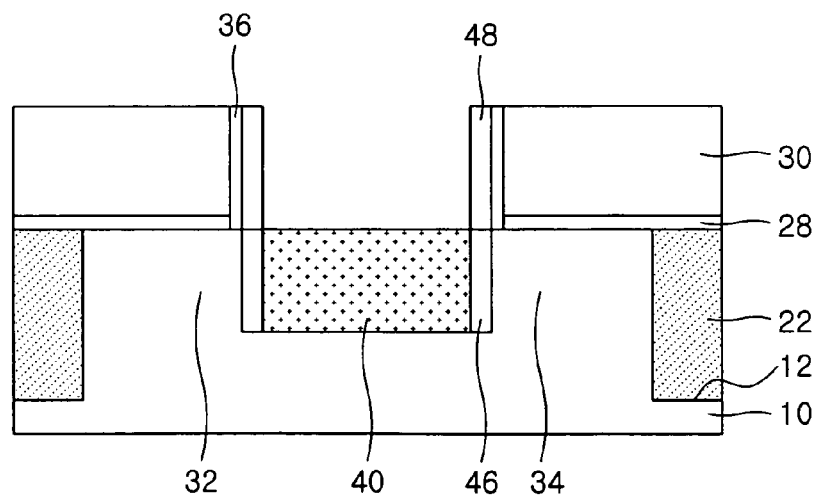

Referring to FIGS. 12A and 12B, an upper surface of the sacrificial layer 40 is exposed by removing a portion of the single crystal layer 42 so that the remaining single crystal layer 42 may have a same height as the sacrificial layer 40. Resultantly, the single crystal layer 42, a portion of which has been removed, is divided into the pair of channel semiconductor layers 44 connected, in a form of a bridge, with the upper side portions of the pair of semiconductor posts 32 and 34 extending in the first direction and the pair of junction auxiliary layers 46 perpendicular to the first direction, formed between the channel semiconductor layers 44 and contacting the pair of semiconductor posts 32 and 34. Subsequently, the insulation spacers 48 having the same thickness as the junction auxiliary layers 46, or having a shape of being rounded toward an upper portion thereof, are formed on the junction auxiliary layers 46.

Figure 13A:
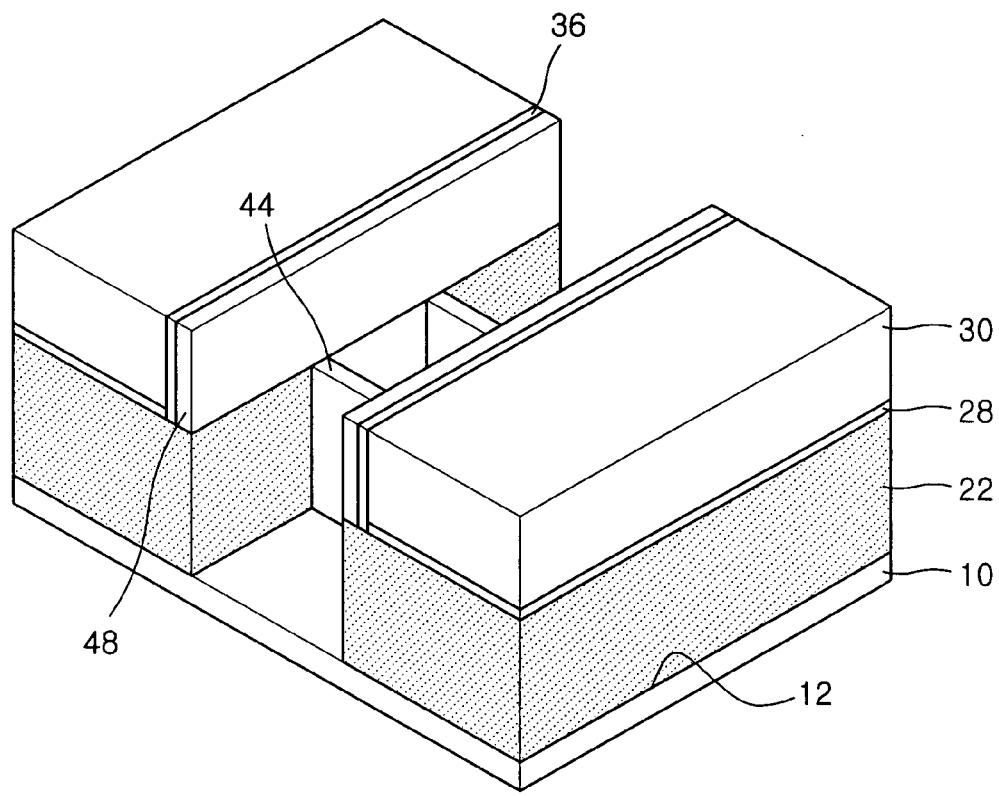
Figure 13B:
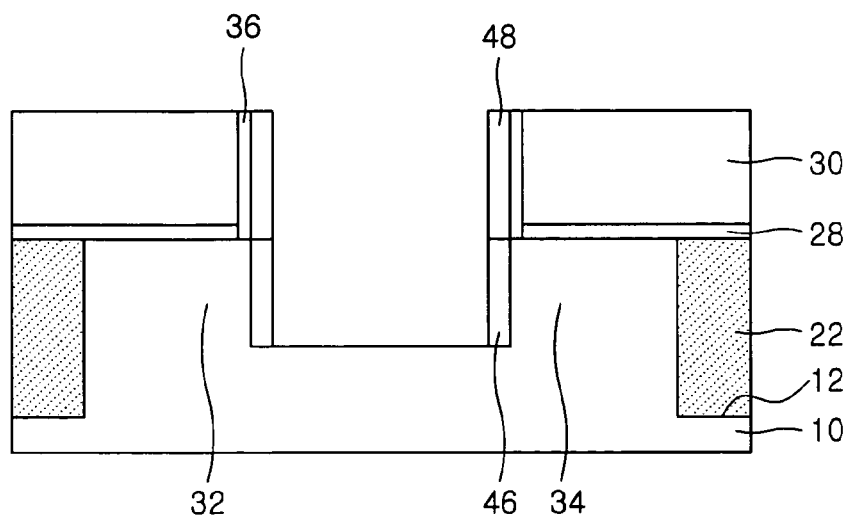

Referring to FIGS. 13A and 13B, outer sidewalls of the channel semiconductor layers 44 are exposed by etching the isolation layer 22 beyond the channel semiconductor layers 44 using the sacrificial layer 40, the channel semiconductor layers 44, and the insulation spacers 48 for etching masks. Subsequently, the semiconductor substrate 10 is exposed by removing the sacrificial layer 40. Alternatively, the sacrificial layer 40 may be first removed and then the isolation layer 22 outside of the channel semiconductor layers 44 can be removed. The sacrificial layer 40 may also be removed using an etching solution including a mixed solution of $H_2O_2$, HF, and $CH_3COOH$, and peracetic acid, and isotropic-dry etching.

Figure 14A:
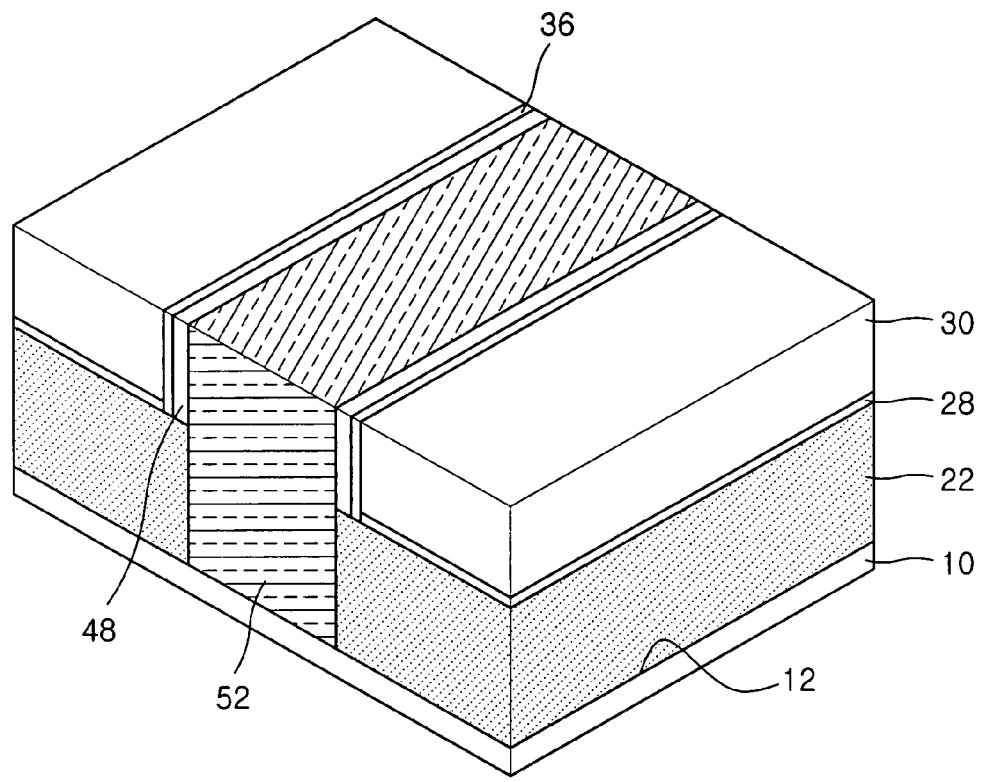
Figure 14B:
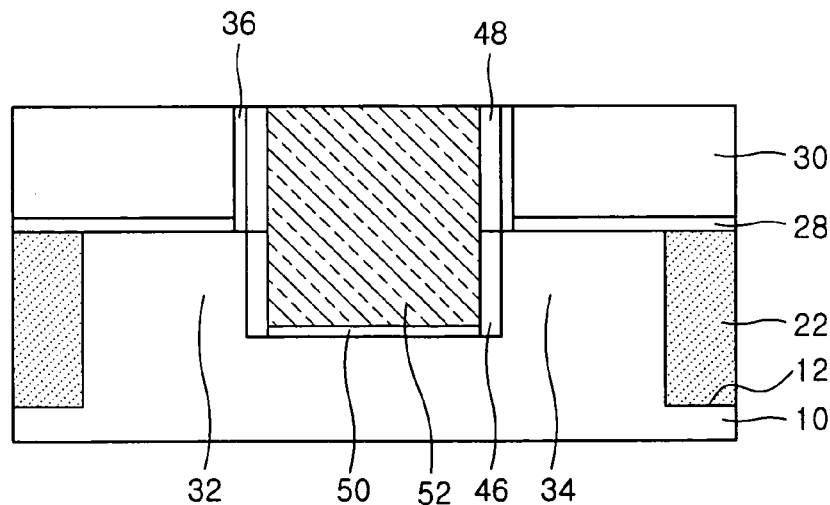

Referring to FIGS. 14A and 14B, the gate insulation layer 50 is formed on the resultant structure between the insulation spacers 48 to surround the channel semiconductor layers 44. The gate insulation layer 50 may be made of a thermal oxide film and an insulation film having a high dielectric constant, e.g., an oxide film or an ONO film. Subsequently, the gate electrode layer 52 is formed on the gate insulation layer 50. The gate electrode layer 52 may be formed using a single layer or a complex layer selected from among amorphous polysilicon, doped polysilicon, poly-SiGe, and a conductive metal content material. The conductive metal content material may be made of at least one layer selected from among a metal such as tungsten and molybdenum and conductive metal nitride films such as a titanium nitride film, a tantalum nitride film, and a tungsten nitride film.

Advantageously, according to the semiconductor device having the multi-bridge-channel and the method for fabricating the same, the gate electrode layer is formed in a self-aligning manner, thereby preventing misalignment with respect to the channel semiconductor layer.

Further, it is possible to form the channel semiconductor layer having the same threshold voltage using the interim insulation spacers having the same thickness.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device having a multi-bridge-channel, comprising:

a first semiconductor post protruding a first predetermined height from a surface of a semiconductor substrate and having a source region in an upper side portion thereof;

a second semiconductor post protruding a second predetermined height from the surface of the semiconductor substrate, the second semiconductor post facing the first semiconductor post and having a drain region in an upper side portion thereof;

a pair of channel semiconductor layers connecting the upper side portion of the first semiconductor post to the upper side portion of the second semiconductor post;

a gate insulation layer on the pair of channel semiconductor layers and the semiconductor substrate, the gate insulation layer surrounding at least a portion of the pair of channel semiconductor layers;

a gate electrode layer on the gate insulation layer to enclose at least a portion of a region between the pair of channel semiconductor layers; and a pair of junction auxiliary layers formed between the pair of channel semiconductor layers, the pair of junction auxiliary layers contacting the gate electrode layer, the upper side portion of the first semiconductor post, and the upper side portion of the second semiconductor post, and having a same width as a width of the pair of channel semiconductor layers.

2. The semiconductor device as claimed in claim 1, wherein the first predetermined height and the second predetermined height are the same.

3. The semiconductor device as claimed in claim 1, wherein the surface of the semiconductor substrate is a bottom of a trench etched a predetermined depth from an upper surface of the semiconductor substrate.

4. The semiconductor device as claimed in claim 1, further comprising:

an insulation mask pattern on the first and second semiconductor posts; and insulation spacers on facing lateral walls of the insulation mask pattern.

5. The semiconductor device as claimed in claim 4, wherein a width of the insulation spacers is the same as a width of the pair of junction auxiliary layers.

6. The semiconductor device as claimed in claim 4, wherein a width of the insulation spacers is constant from a lower portion thereof to an upper portion thereof.

7. The semiconductor device as claimed in claim 1, wherein an upper surface of the pair of channel semiconductor layers is coplanar with upper surfaces of the first and second semiconductor posts.

8. The semiconductor device as claimed in claim 1, wherein the pair of channel semiconductor layers connects both ends of the upper side portion of the first semiconductor post to both ends of the upper side portion of the second semiconductor post.

9. The semiconductor device as claimed in claim 1, wherein the gate electrode layer encloses both lateral walls and an upper surface of the pair of channel semiconductor layers and is self-aligned between the insulation spacers.

10. The semiconductor device as claimed in claim 1, wherein the pair of channel semiconductor layers and the pair of junction auxiliary layers are silicon epitaxial layers.

* * * * *